(12) United States Patent
Leng et al.

(10) Patent No.: US 7,344,987 B2
(45) Date of Patent: Mar. 18, 2008

(54) METHOD FOR CMP WITH VARIABLE DOWN-FORCE ADJUSTMENT

(75) Inventors: Yaojian Leng, Plano, TX (US); Nilesh Shantaram Doke, Allen, TX (US); Stanley Monroe Smith, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 58 days.

(21) Appl. No.: 11/445,669

(22) Filed: Jun. 2, 2006

(65) Prior Publication Data

US 2007/0281482 A1    Dec. 6, 2007

(51) Int. Cl.
*H01L 21/302* (2006.01)
(52) U.S. Cl. .............. 438/689; 438/692; 438/691; 257/E21.304
(58) Field of Classification Search ............ 438/689, 438/692, 691; 257/E21.304
See application file for complete search history.

(56) References Cited

U.S. PATENT DOCUMENTS

| | | | |
|---|---|---|---|
| 5,733,177 A | 3/1998 | Tsuchiya et al. | |
| 6,113,465 A | 9/2000 | Kim et al. | |
| 6,315,645 B1* | 11/2001 | Zhang et al. | 451/65 |
| 6,383,928 B1 | 5/2002 | Eissa | |
| 6,551,922 B1 | 4/2003 | Grant et al. | |
| 6,806,193 B2 | 10/2004 | Korthuis et al. | |
| 6,913,527 B2 | 7/2005 | He | |
| 2002/0148997 A1 | 10/2002 | Minamihaba et al. | |
| 2006/0211157 A1* | 9/2006 | Smith et al. | 438/6 |
| 2006/0228991 A1* | 10/2006 | Kitajima et al. | 451/5 |

OTHER PUBLICATIONS

"Introduction to Copper/Low-K Interconnects & Electromigration Fundamentals", Alvin L.S. Loke, and Tin Tin Wee, IEEE Solid State Circuits Society, Sep. 12, 2003, 21 pgs.

* cited by examiner

*Primary Examiner*—Asok K. Sarkar
*Assistant Examiner*—Victor V. Yevsikov
(74) *Attorney, Agent, or Firm*—W. James Brady, III; Frederick J. Telecky, Jr.

(57) ABSTRACT

The present invention relates to a method for performing chemical mechanical polishing. A high down-force step is performed. A low down-force step is performed. At least one of the down-force steps is modified, based on if one of the down-force steps exceeds an acceptable tolerance associated therewith. Other systems and methods are also disclosed.

18 Claims, 8 Drawing Sheets

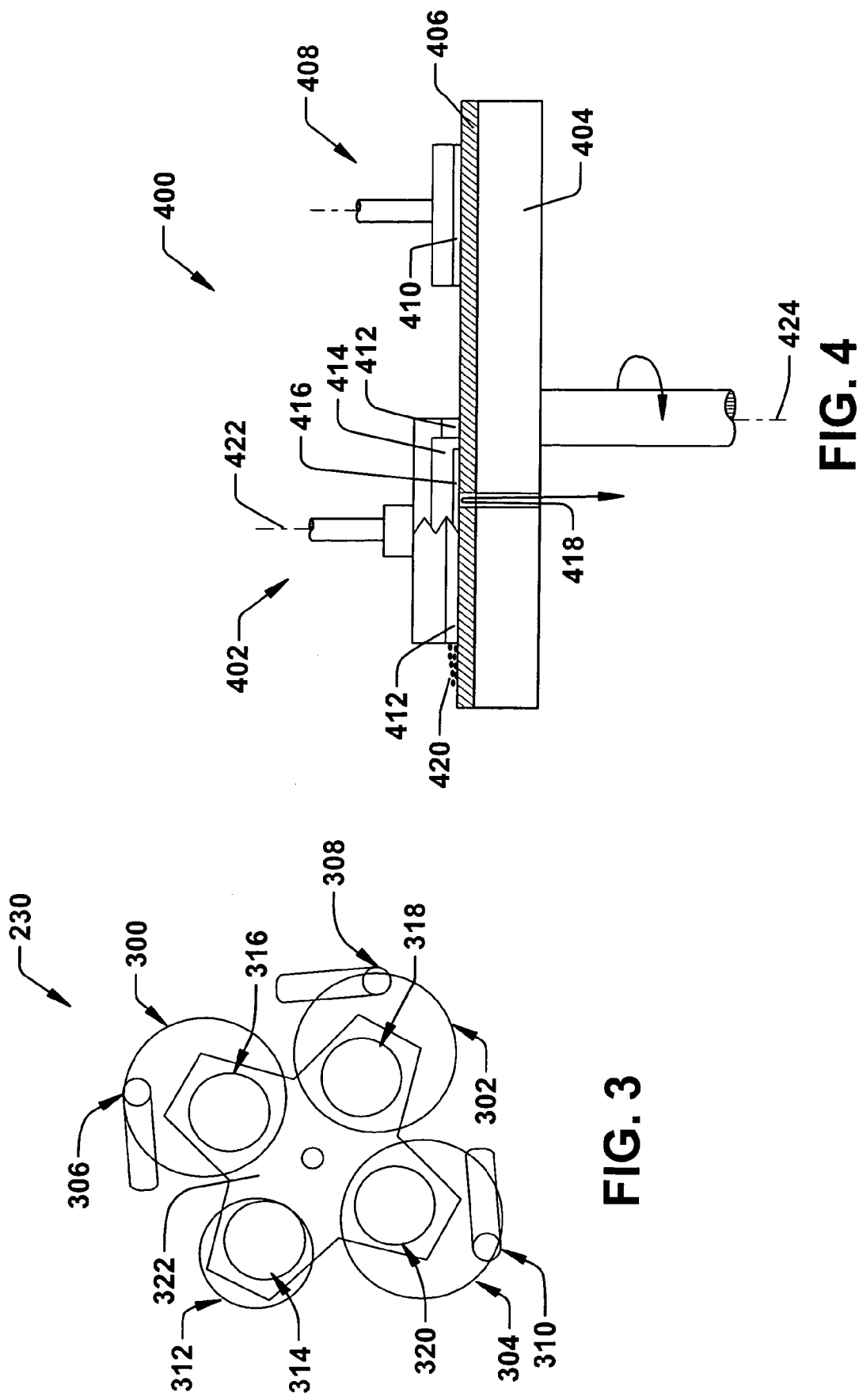

METHOD FOR CMP WITH VARIABLE DOWN-FORCE ADJUSTMENT

FIELD OF THE INVENTION

The invention is generally related to forming interconnects in semiconductor devices, and more particularly to a chemical mechanical polishing process with multiple steps.

BACKGROUND OF THE INVENTION

Over the last four decades, the density of integrated circuits has increased by a relation known as Moore's law. Stated simply, Moore's law says that the number of transistors on an integrated circuit doubles approximately every 18 months. Thus, as long as the semiconductor industry can continue to uphold this simple "law," integrated circuits double in speed and power approximately every 18 months. In large part, this remarkable increase in the speed and power of integrated circuits has ushered in the dawn of today's information age.

Unlike laws of nature which hold true regardless of mankind's activities (e.g,. the law of gravity), Moore's law only holds true only so long as innovators overcome the technological challenges associated with it. For example, one recent challenge involves changing from a traditional aluminum interconnect to a copper interconnect to reduce the resistance of the interconnect. Unfortunately, copper is very difficult to etch in a semiconductor process flow. Therefore, damascene processes have been proposed to form copper interconnects.

As shown in FIG. 1a, a typical damascene process consists of forming an interlevel dielectric 12 over a semiconductor body 10. The interlevel dielectric 12 is then patterned and etched to remove the dielectric material from the areas 14 where the interconnect lines are desired, as shown in FIG. 1b. In a dual damascene process, via holes are also formed at this time. Referring to FIG. 1c, a barrier layer 16 is then deposited over the structure including over the dielectric 12 and in the areas 14 where the dielectric has been removed. A copper seed layer 18 is then formed over the barrier layer 16. The copper layer 20 is then formed from the seed layer 18 using, for example, an electroplating process, as shown in FIG. 1d. Chemical-mechanical polishing (CMP) is then used to remove the excess copper and planarize the copper 20. The Copper CMP process is typically divided into Copper removal step and barrier removal step where typically different polishing slurry is used. The Copper removal step is typically further divided into two steps: a high down force step (HDF) when higher polishing down force is used to achieve high polishing rate, hence, high throughput, and a low down-force (LDF) step when lower polishing down force is used to reduce dishing, however, with reduced polishing rate. After the Copper removal step, almost all the excess Copper layer has been removed, as shown in FIG. 1e. Typically an over polish step is used after each of the Cu removal steps to ensure all residue Copper is removed, or all Copper is cleared. As indicated by numeral 22, dishing may be present. The barrier layer 16 on top of the surface is then removed by barrier polishing to eliminate undesired shorting among adjacent Copper trenches. One resulting structure may be seen in FIG. 1f.

As damascene processing is a recent development, aspects of the process need improvement. One of the most significant challenges in CMP is finding a balance between throughput (i.e., the number of wafers processed) and yield (i.e., the quality of the wafers processed). For Copper CMP process, the challenge is to find an effective polishing time to switch from High Down-Force (HDF) step to Low Down-Force (LDF) step. If the switch from HDF to LDF happens too early, significantly longer time of LDF step has to be used in order to clear the Copper. This would significantly lower the process throughput. On the other hand, if the switch from HDF to LDF happens too late, significant Copper dishing has already been created in the HDF step. This will result in high dishing at the end of LDF step. An optimized process is the one with correct transition point from HDF to LDF so both throughput requirement and dishing requirement can be met.

For example, "dishing" (formation of a dish-like, concave feature in a surface caused by pad bending during polishing) can occur in CMP. One method of preventing dishing is to remove semiconductor material at a very slow rate. While such a slow removal rate can provide for low dishing, it also slows throughput, which potentially limits the manufacturer's income. Conversely, if the semiconductor material is removed at a very fast rate, throughput will be improved but dishing can be more pronounced. Because the dishing may result in metal thickness variation depending on the local pattern density and difficulty in patterning at the next level, removing the semiconductor material at a fast rate also potentially limits the manufacturer's income.

Thus, a method of chemical mechanical polishing that can achieve a balance between throughput and performance is needed.

SUMMARY OF THE INVENTION

The present invention relates to a method for performing chemical mechanical polishing. A high down-force step is performed. A low down-force step is performed. At least one of the down-force steps is modified, based on if one of the down-force steps exceeds an acceptable tolerance associated therewith. Other systems and methods are also disclosed.

BRIEF DESCRIPTION OF THE DRAWINGS

FIG. 3 is a schematic top view of one chemical mechanical polishing apparatus;

FIG. 4 is a sectional view of one chemical mechanical polishing apparatus during a wafer polishing operation;

DETAILED DESCRIPTION OF THE INVENTION

Figure 1A:
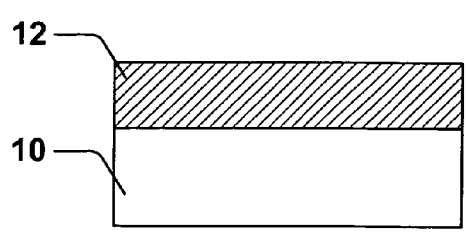
FIGS. 1a, 1b, 1c, 1d, 1e, and 1f are cross sectional diagrams of a prior art damascene process.
Figure 1B:
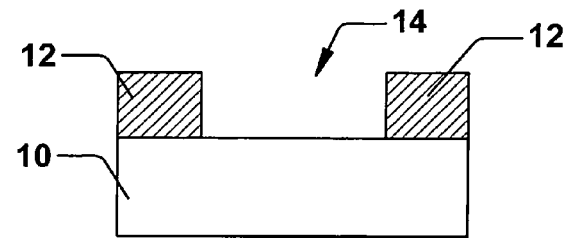
Figure 1C:
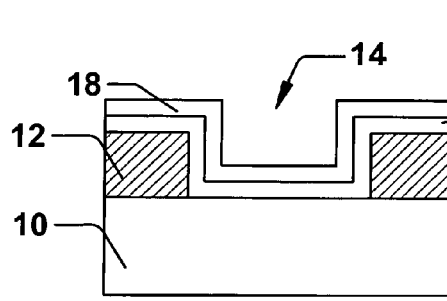
Figure 1D:
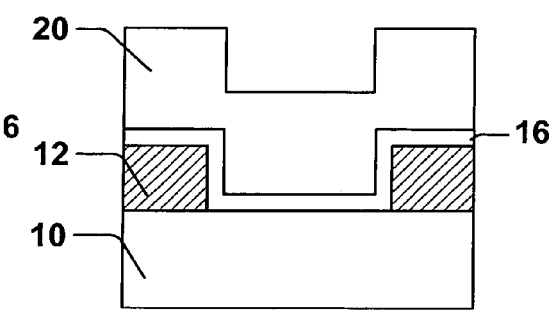
Figure 1E:
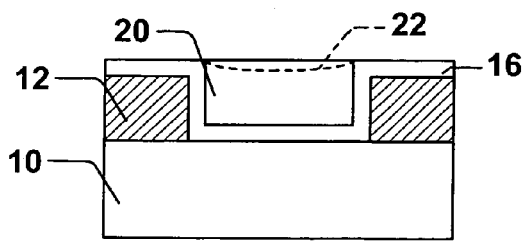
Figure 1F:
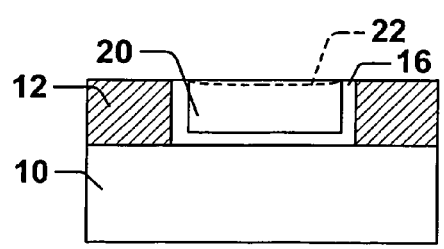

The present invention will now be described with reference to the drawings wherein like reference numerals are used to refer to like elements throughout, and wherein the illustrated structures are not necessarily drawn to scale.

Figure 2:
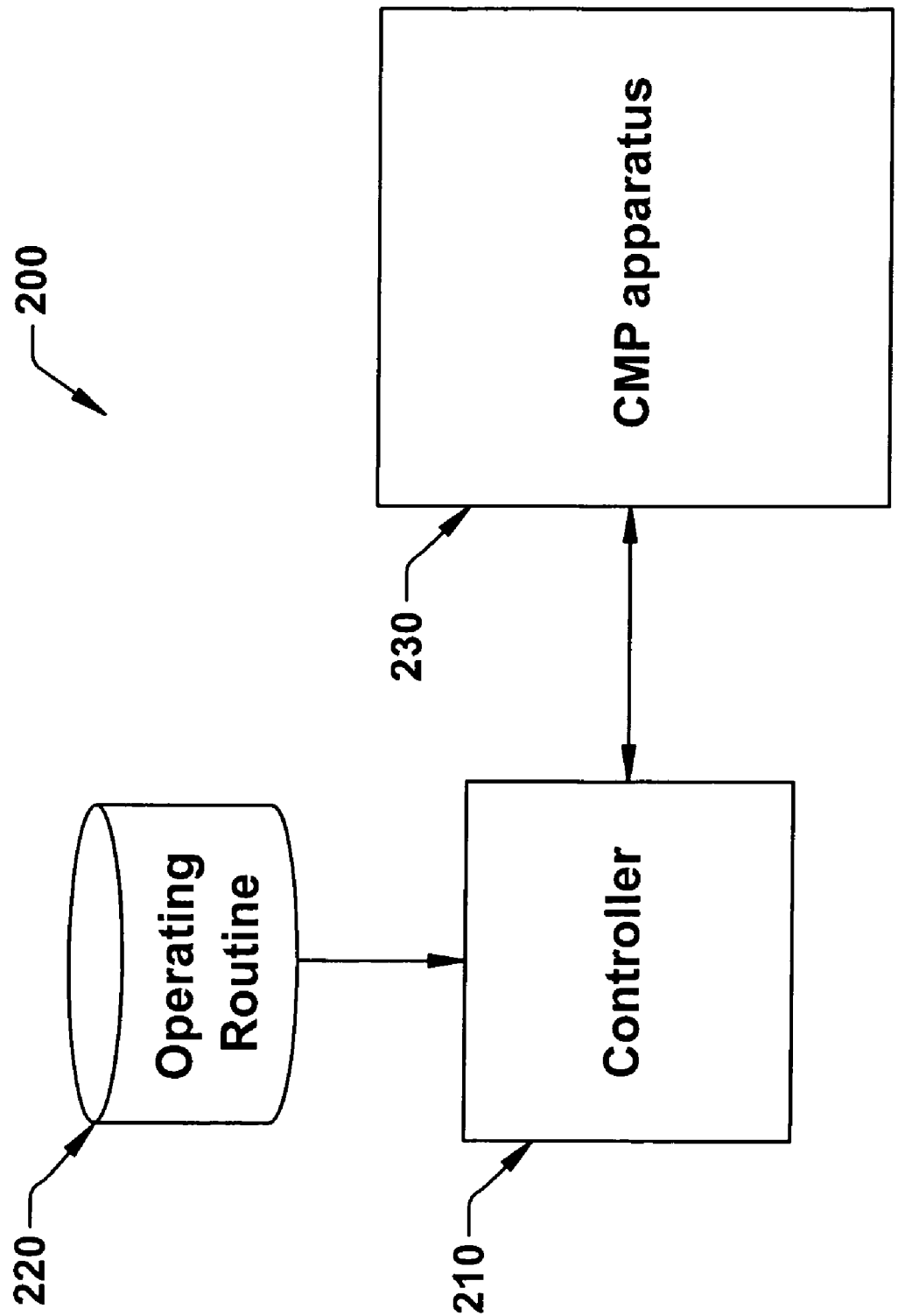
FIG. 2 is block diagram of one chemical polishing system.

Referring now to FIG. 2, a chemical mechanical polishing system 200 comprises controller 210, operating routine 220, and chemical mechanical polishing apparatus 230. In general, the CMP system 200 works to achieve chemical mechanical planarization or polishing of wafers or wafer structures. Controller 210 comprises any general-purpose controller (e.g., DSP, microprocessor, personal computer) capable of processing a set of programmable data and subsequently controlling the operation of CMP apparatus 230 in accordance with the programmable data. In typical embodiments, controller 210 is configured to perform programmable data included in operating routine 220. As discussed in more detail herein, the operating routine 220 relates to methods of the present invention and can include controller instructions, stored data, and software components.

FIG. 3 is a schematic top view of one CMP apparatus 230, such as a Mirra® CMP apparatus available from Applied Materials, Inc. As one skilled in the art will appreciate, FIG. 3's illustrated embodiment in no way limits the scope of the present invention, which encompasses other CMP apparatuses as well. The illustrated CMP apparatus 230 includes three polishing stations 300, 302, 304; three conditioning arms 306, 308, 310, and a loading/unloading station 312. Four polishing heads 314, 316, 318, 320 are rotatably mounted to a carousel 322 disposed above the polishing stations.

In FIG. 3's illustrated embodiment, a wafer is loaded on a polishing head 314 at the loading station 312 and is then rotated through the three polishing stations 300, 302, 304. Although the illustrated CMP apparatus 230 is shown having three polishing stations 300, 302, 304, the present invention may be employed using virtually any number of polishing stations, each of which may comprise one of several pad types.

FIG. 4 shows a side view of one polishing station 400. Polishing station 400 comprises a wafer carrier (polishing head) 402, platen 404 supporting polishing pad 406, and pad conditioner 408 including conditioning disk 410. Polishing head 402 includes an annular retaining ring 412, a pocket 414 for housing the wafer 416, and a plurality of variable-pressure chambers (not shown) for exerting either suction or pressure onto the backside a wafer, as well as other internal components. In various embodiments, polishing station will include an optical device 418 suitably positioned to detect an endpoint.

CMP apparatus 230 generally works in tandem with a general-purpose controller (e.g., controller 210) that allows a variable down-force to be applied to polishing head 402, allows polishing head 402 and platen 404 to be rotated at variable and independent rates, and allows slurry 420 and/or other materials to be applied to polishing pad 406.

During operation, polishing head 402 is preferably rotated about spindle axis 422 at a desired rate while platen 404 is preferably rotated around platen axis 424 at an independent desired rate. In various embodiments, abrasive slurry 420 comprised of slurry particles is present during polishing. In various embodiments, the slurry particles are comprised of silica ($SiO_2$) or alumina ($Al_2O_3$), depending on the surface to be polished. The combined action of the down-force of polishing head 402, the respective rotations of polishing head 402 and platen 404, and the chemical and mechanical effects of abrasive slurry 420 combine to polish the surface of wafer 416 to a desired planarity and thickness.

In more detail, in one typical CMP process, wafer 416 is held inside pocket 414 with upward suction applied to its back surface so as to keep the wafer raised above the lower face of retaining ring 412. A spindle motor (not shown) then begins rotating head 402 around spindle axis 422. Meanwhile, polishing head 402 is lowered, retaining ring 412 is pressed onto pad 406, and retaining ring 412 is polished by pad 406, with wafer 416 recessed just long enough for polishing head 402 to reach polishing speed. When polishing head 402 reaches wafer polishing speed, typically about three seconds later, wafer 416 is lowered facedown inside pocket 414 to contact the surface of polishing pad 406, so that the wafer is substantially flush with and constrained outwardly by retaining ring 412. Retaining ring 412 and wafer 416 continue to spin relative to pad 406, which is rotating along with platen 404. The optical device 418 transmits light onto the face of wafer, and detects a change in the light reflected from the surface that signals the end of polishing. For example, at the end of a Copper removal step, the surface reflectance changes drastically from mirror-like Cu surface to a less reflective barrier (Ta or TaN) surface.

After CMP, polishing head 402 and wafer 416 are lifted, and pad 406 is generally subjected to a high-pressure spray of deionized water to remove slurry residue and other particulate matter from the pad. Other particulate matter may include wafer residue, CMP slurry, oxides, organic contaminants, mobile ions and metallic impurities. Wafer 416 is then subjected to a post-CMP cleaning process. U.S. Pat. No. 6,806,193 (which is incorporated herein in its entirety) illustrates one sample post-CMP cleaning process.

Figure 5:
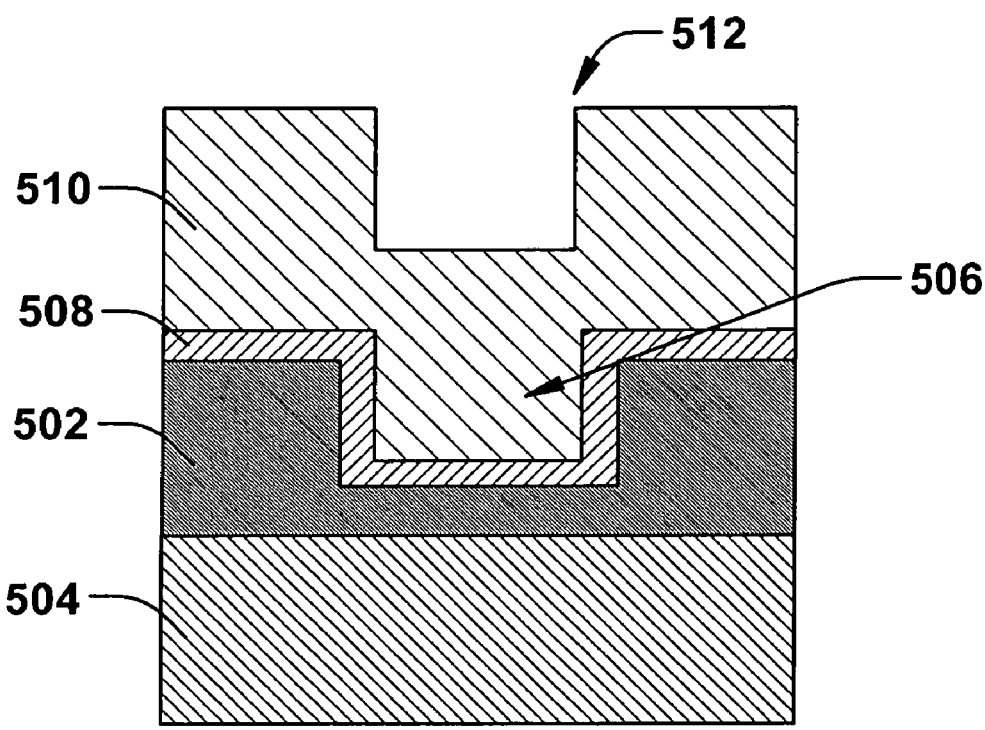
FIG. 5 is a cross sectional view illustrating one Cu Damascene wiring structure prior to chemical mechanical polishing.

CMP system 200 can be configured to planarize a wide variety of wafer structures. Exemplary wafer structures include, but are not limited to: Al wiring, Cu wiring, W wiring, and the like. For example, in FIG. 5, one can see an exemplary Cu Damascene wiring structure 500, before planarization, that includes a dielectric layer 502 that is formed on a semiconductor body 504 on which devices are fabricated. The features of the wafer are exaggerated in FIG. 5 for illustrative purposes. As illustrated, the dielectric layer 502 includes a wiring trench 506. A barrier film 508 is present over the entire surface of the dielectric layer 502. As shown, the barrier film 508 and the copper layer 510 fill the wiring trench 506. Notably, the exterior surface 512 of the copper layer is non-planar and may cause processing difficulties due to depth of focus and other sundry issues. CMP can be performed to planarize the non-planar structure.

In accordance with the present invention, CMP system 200 includes operating routine 220 that can be structured to perform methods of planarizing (or "polishing") wafer structures, including but not limited to those structured mentioned above. The operating routines of the present invention relate generally to a two-step CMP process where a series of runs is performed, and where one of the two steps of the CMP process is modified in a next run based on feedback related to a prior run. In one embodiment, the first step includes a high down-force which delivers high removal rate but also high dishing, and the second step includes a low down-force which delivers low removal rate but low dishing. In alternative embodiments, the first step delivers low selectivity in removal rate between metal removed and its underline barrier layer and/or dielectric layer, and the second step delivers high selectivity in removal rate. Yet, in other alternative embodiments, the first step uses one type of polishing slurry, and the second step uses another type of slurry. Between prior runs and next runs, CMP parameters may be modified to change one of several process considerations, including but not limited to: a removal rate, a selectivity, a performance characteristic (such as dishing, erosion, particle count, or CMP scratch count). Furthermore, the methods of the present invention may be implemented in association with various types of monitoring components and systems, and any such system or group of components, either hardware and/or software, incorporating such a method is contemplated as falling within the scope of the present invention.

FIG. 6 and FIGS. 7a-7c illustrate one method of chemical mechanical polishing in accordance with the present invention.

Figure 6:
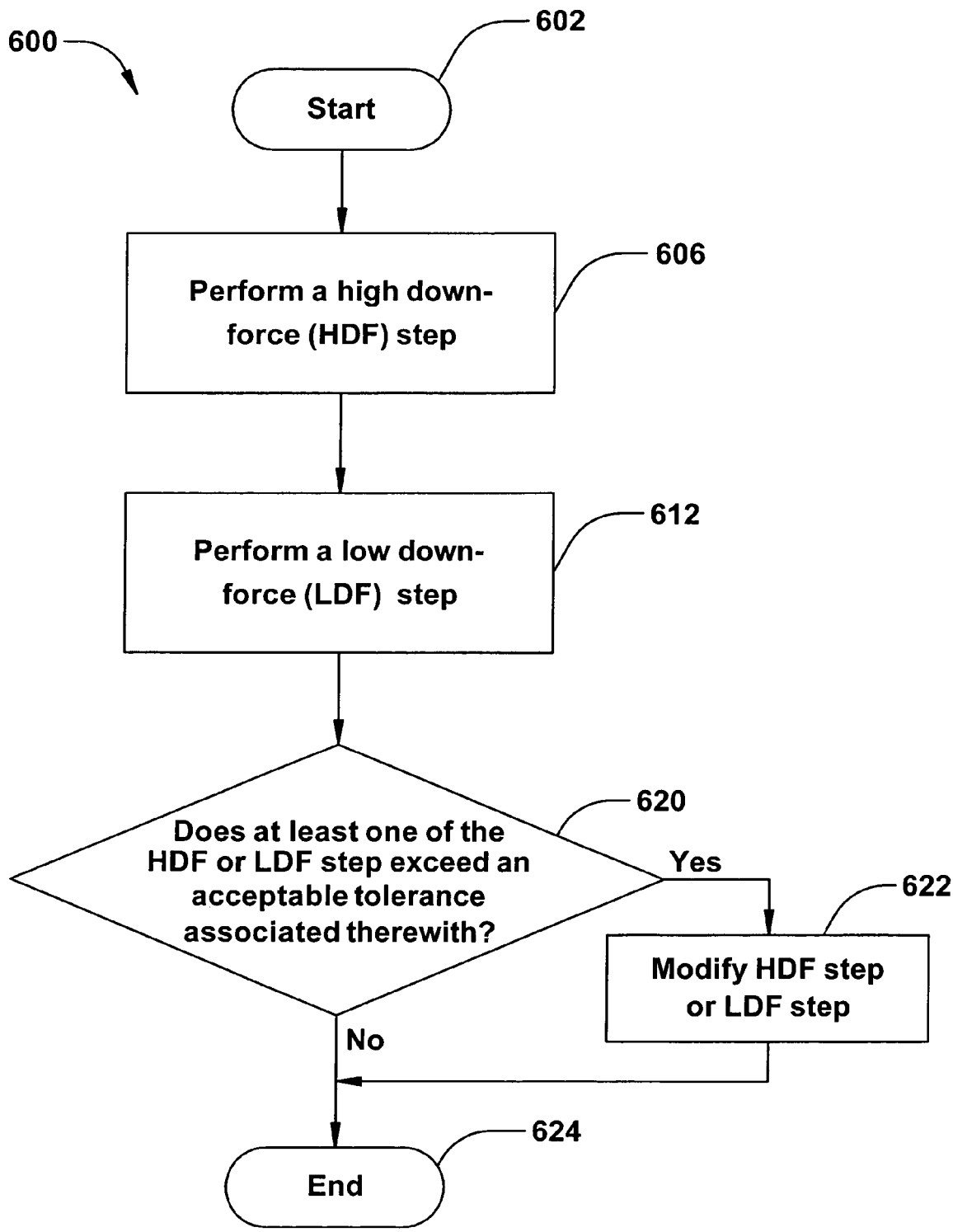
FIG. 6 is a flow diagram illustrating one method of performing a chemical mechanical polishing process in accordance with the present invention.
Figure 7A:
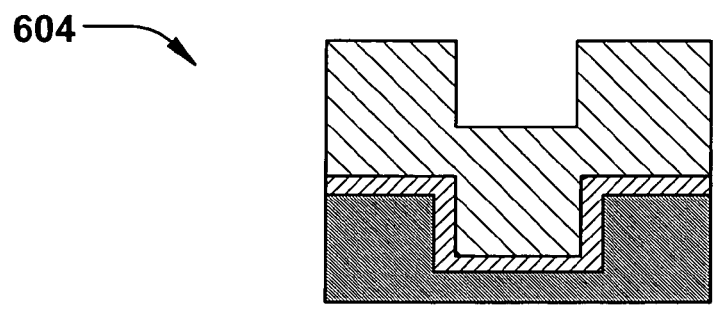
FIGS. 7a, 7b, 7c, and 7d are cross sectional views illustrating one method of performing chemical mechanical polishing in accordance with the present invention.

As FIG. 6 shows, method 600 starts at 602 when a wafer structure is loaded onto a CMP apparatus. As previously alluded to, the CMP apparatus planarizes wafers (or wafer structures) as part of an overall wafer fabrication process. Each wafer typically includes a number of electrical connections and electrical isolation regions that are established using alternating layers of conductors and insulators. As illustrated in FIG. 7a, one wafer structure 604 could be the Cu Damascene wiring structure discussed above.

Figure 7B:
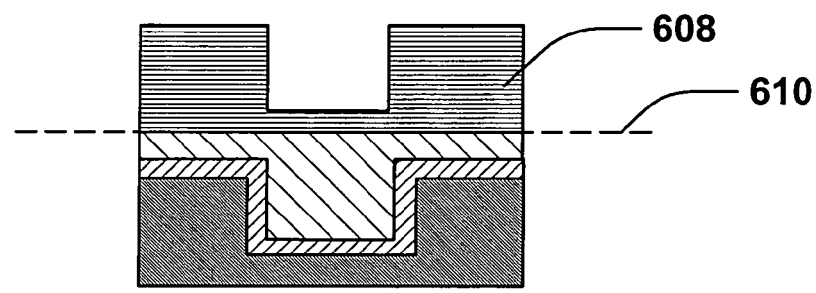

In step 606, a CMP system 200 performs a high down-force step. In FIG. 7b's illustrated embodiment, the high down-force step removes upper material 608 at a relatively high removal rate above an upper endpoint 610, which may also be referred to as a high down-force endpoint. For example, the upper material removal rate may range from approximately 2000 A/min to approximately 10000 A/min, and is approximately 6000 A/min in one embodiment. In one embodiment, the conditions for the high down-force step are: down-force of approximately 3.2 psi, a polishing head rotational speed of approximately 57 rpm, a platen rotational speed of approximately 63 rpm, and a polishing time of approximately 90 seconds. In these and other embodiments, the high down-force step may utilize a slurry comprising $Al_2O_3$. Note that the upper endpoint 610 can relate to any position in a wafer or wafer structure, and is not limited to the position illustrated FIG. 7b.

Figure 7C:
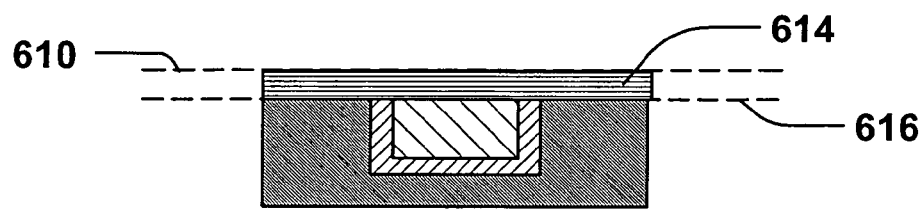
Figure 7D:
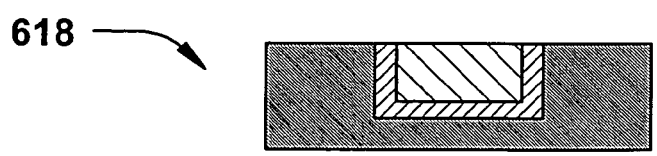
Figure 8:
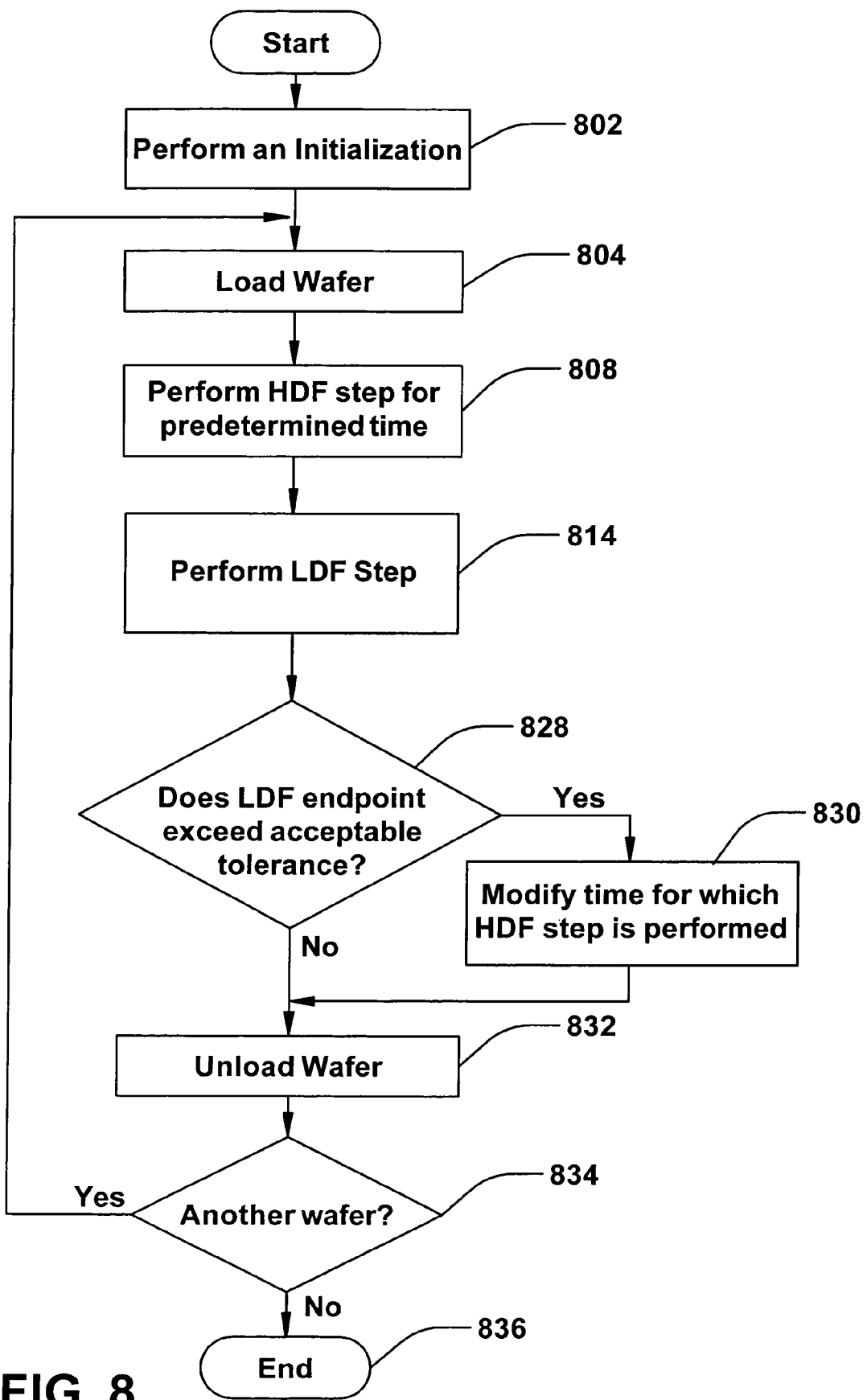
FIG. 8 is a flow diagram illustrating one method of performing a chemical mechanical polishing process in accordance with the present invention.

In step 612, a low down-force step is performed. In FIG. 7c's illustrated embodiment, the low down-force step removes lower material 614 at a relatively low removal rate above the lower endpoint 616, which may also be referred to as a low down-force endpoint. For example, the lower material removal rate may range from approximately 500 A/min to approximately 3500 A/min, and is approximately 2000 A/min in a particular embodiment. In one embodiment, the conditions for the low down-force step are: down-force of approximately 1.5 psi, a polishing head rotational speed of approximately 87 rpm, a platen rotational speed of approximately 93 rpm, and a polishing time of approximately 100 seconds. The low down-force step may utilize a slurry comprising $Al_2O_3$. Note that the lower endpoint 616 can relate to at any position in wafer or wafer structure, and is not limited to the position illustrated FIG. 7c. After step 612, a planarized structure 618 may result as shown in FIG. 7d.

In step 620, it is determined if at least one of the down-force steps from prior run exceeds an acceptable tolerance associated with that down-force step. If at least one of the down-force steps exceeds an acceptable tolerance associated with that down-force step, then the method goes to step 622 for the next run. If the LDF and HDF time for the prior run are within tolerance, then no modification is made for the next run.

In step 622, it is determined if at least one of the down-force steps exceeds an acceptable tolerance associated with that down-force step. For example, in one embodiment the HDF time for the next run is modified based on if the LDF time for the prior run exceeds its acceptable tolerance. The low limit tolerance (shortest time) for the LDF step can be established so the dishing performance satisfies the desired requirements for a specific process, and the high limit tolerance (longest time) for LDF step is established so the overall process can achieve desired throughput.

FIG. 8 and FIGS. 9a-9d illustrate a method 800 of chemical mechanical polishing in which the high down-force step is performed for a predetermined time.

During step 802, an initialization is performed. In general, the initialization may relate to the HDF step or the LDF step as well as various CMP system variables. In one embodiment, the initialization pre-sets the initial time for which the HDF polishing is performed. In various embodiments, this initial time will be pre-set to a conservative value. For example, in various embodiments characterized by a 1 um ECD Copper Film and trench depth of 3000 A, the initial time for which the HDF step is performed may be set to a conservative value between about 60 seconds and about 100 seconds, and is about 80 seconds in a particular embodiment.

Figure 9A:
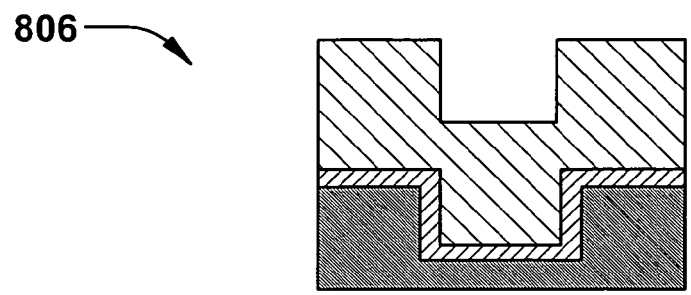
FIGS. 9a, 9b, 9c, and 9d are cross sectional views illustrating one method of performing chemical mechanical polishing in accordance with the present invention.

In step 804, a wafer or wafer structure is loaded onto a CMP apparatus as previously described. As illustrated in FIG. 9a, one wafer structure 806 could be the Cu Damascene wiring structure discussed above.

Figure 9B:
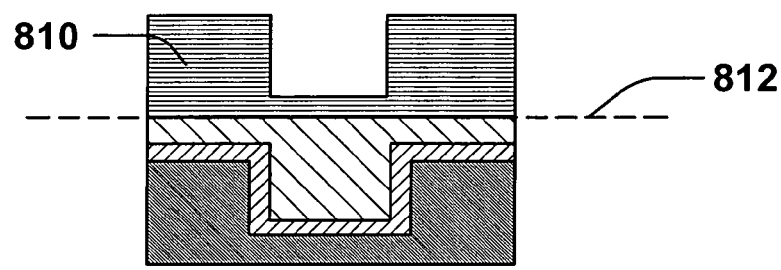

In step 808, HDF polishing is first performed for the initial time. As shown in FIG. 9b, this HDF polishing removes upper material 810 at a relatively high removal rate above an upper endpoint 812. Thus, the initial time may be suitably chosen to have no Copper break through during HDF step in the worst condition, such as highest removal rate under normal polishing rate variation and thinnest incoming Copper thickness under normal process variation. The Copper break through happens when upper end point 812 gets close to the barrier layer.

Figure 9C:
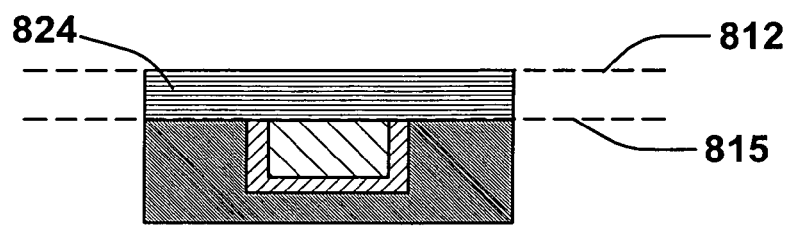
Figure 9D:
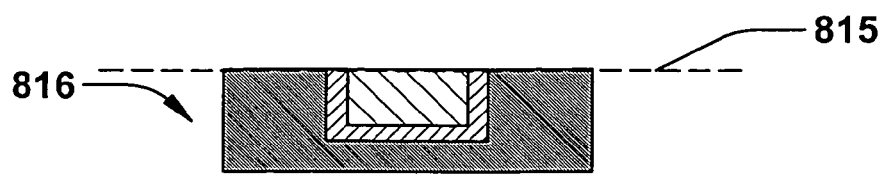

In step 814, LDF polishing is performed. As shown in FIG. 9c, this LDF polishing removes lower material 824 at a relatively low removal rate until a lower endpoint 815 is reached, indicating Copper is cleared. Various methods can be used to detect the lower endpoint 815, such as optical reflectance or motor current. After step 814, an additional barrier removal step may be performed, after which a planarized structure 816 may exist as shown in FIG. 9d.

In step 828, the CMP system determines if the LDF endpoint for the current run exceeds an acceptable pre-established tolerance. For example, the CMP system 200 could determine if the total height at which the lower endpoint 815 occurred was within the acceptable endpoint tolerance or if the total polishing time (or any step or sub-step polishing time) was within the acceptable tolerance. It may also be determined if any of the other endpoints (e.g. 812) exceeds a tolerance associated therewith.

In step 830, the time for which the high down-force step is performed is modified for the next run, based on if an endpoint from prior run exceeds the acceptable tolerance associated therewith. For example, in one embodiment, the HDF polishing time in the subsequent run will be the previous run HDF polishing time adjusted by the product of a constant multiplied by the amount that the LDF polishing time from prior run exceeded the tolerance associated with the LDF polishing time. Thus, the following equation would be consistent with various methods of the present invention:

$$T_{HDF, n+1} = T_{HDF, n} + \alpha^*(T_{LDF, n} - T_{LDF, Target})$$

where $T_{HDF, n+1}$ is the time for which HDF polishing is performed in a subsequent run HDF step; $T_{HDF, n}$ is the time for which HDF polishing is performed in the current run HDF step; $T_{LDF, n}$ is the time for which the LDF polishing is performed in the current run LDF step; $T_{LDF, Target}$ is the time for which the LDF polishing would have been expected to perform; and wherein $\alpha$ is a constant that is process and model specific. For example, in one embodiment $\alpha$ is about $\frac{1}{3}$.

In step 832, the planarized wafer or wafer structure is unloaded from CMP apparatus as previously discussed.

In step 834, a determination is made whether another wafer should be processed. If another wafer should be loaded, the method returned to step 804 and processes another wafer. In this subsequent iteration, the pre-set time may or may not be used, depending on whether previous iterations had an LDF that exceeded an acceptable tolerance. The determination of whether to process another wafer may be made based on a number of factors. In one embodiment, the determination is made based on whether a pad is within an acceptable range. For example, as polishing pads are used in CMP, they tend to wear out (e.g., they become thinner). In such an embodiment, when the polishing pad exceeds an acceptable range, the method may end at step 836. A user may then replace the pad, and start method 800 again.

Although the invention has been shown and described with respect to a certain aspect or various aspects, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for performing chemical mechanical polishing of a first wafer in a first run and a second wafer in a second run, wherein the first and second runs each comprise a first polish step and a second polish, the method comprising:
    performing the first polishing step of the first run for a first polishing time;
    performing the second polishing step of the first run for a second polishing time;
    performing the first polishing step of the second run for a third polishing time; and
    performing the second polishing step of the second run for a fourth polishing time,
    wherein the third polishing time is determined based on an endpoint of the second polishing step of the first run.

2. The method of claim 1, where the first polishing step of the first run is a high down force step.

3. The method of claim 2, where the second polishing step of the first run is a low down force step.

4. The method of claim 3, further comprising:
    performing an initialization related to the high down force step of the first run.

5. The method of claim 4 wherein:
    the initialization is performed prior to performing the high down-force step of the first run and performing the low down force step of the first run.

6. The method of claim 1, where the first and second polishing steps of the first run have different selectivities.

7. The method of claim 1, where the first and second polishing steps of the first run have different slurry compositions.

8. A method for determining a polish parameter of a second chemical mechanical process based on whether an acceptable tolerance is achieved during a first chemical mechanical polishing process, the method comprising:
    providing a substrate comprising a layer;
    performing a high down-force polish of the layer employing a first set of high down-force parameters;
    performing a low down-force polish of the layer employing a first set of low down-force parameters;
    determining if at least one of the high down-force polish and low down-force polish is within an acceptable tolerance; and
    if at least one of the high down-force polish and low down-force polish is not within the acceptable tolerance, then determining at least one of a second set of high down-force parameters and a second set of low-down force parameters that can be used in a second chemical mechanical polishing process, wherein the second set of high down-force parameters is different form the first set of high down force-parameters and the second set of low-down force parameters is different from the first set of low-down force parameters.

9. The method of claim 8 wherein the low down force step has a low down-force endpoint associated therewith, and determining if at least one of the high down-force polish and low down-force polish is within an acceptable tolerance comprises determining if the low-down force endpoint is within an acceptable tolerance.

10. The method of claim 9:
    wherein the first set of high down-force parameters comprises a first high down-force polishing time; and
    wherein if the low down-force endpoint is not within the acceptable tolerance, then determining a second high down-force time that can be employed in the second set of high down-force parameters used in the second chemical mechanical polishing process.

11. The method of claim 9, wherein the low down-force endpoint is determined by an optical device.

12. A method for determining a polish parameter of a second chemical mechanical process based on whether an acceptable tolerance is achieved during a first chemical mechanical polishing process, the method comprising:
    (a) performing an initialization;
    (b) loading a wafer;
    (c) performing a first high down-force polish on the wafer, the first high down-force polish employing a first set of parameters;

(d) performing a low down-force step on the wafer to achieve a low down-force polish endpoint;
(e) determining if the low down-force polish endpoint is within an acceptable tolerance; and
(f) if the low down-force endpoint is not within the acceptable tolerance, then determining a second set of parameters that can be used for a second high down-force polish in a second chemical mechanical polishing process, the second set of parameters being different from the first set of parameters.

13. The method of claim 12
wherein the first set of high down-force parameters comprises a first high down-force polishing time; and
wherein if the low down-force endpoint is not within the acceptable tolerance, then determining a second high down-force time that can be employed in the second set of parameters used in the second chemical mechanical polishing process.

14. The method of claim 12, wherein step (a) comprises: pre-setting the high down-force time to a conservative value.

15. The process of claim 12 further comprising:
(g) unloading the wafer;
(h) determining if another wafer should be loaded; and
(i) if another wafer should be loaded, then repeating steps (b)-(g).

16. The process of claim 15 further comprising:
(j) determining if a process variable associated with a polishing pad is outside of an acceptable range.

17. The process of claim 16 further comprising:
(k) if the process variable associated with the polishing pad is outside of the acceptable range, then terminating the process.

18. The method of claim 16 wherein the process variable relates to the viability of the polishing pad.

* * * * *